United States Patent
Tanaka et al.

(10) Patent No.: US 6,191,971 B1
(45) Date of Patent: *Feb. 20, 2001

(54) FERROELECTRIC MEMORY DEVICE

(75) Inventors: Sumio Tanaka, Tokyo; Daisaburo Takashima, Yokohama, both of (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/268,687

(22) Filed: Mar. 16, 1999

(30) Foreign Application Priority Data

Mar. 17, 1998 (JP) .................................. 10-067507

(51) Int. Cl.[7] .................................................. G11C 11/22
(52) U.S. Cl. ...................... 365/145; 365/189.09; 365/210
(58) Field of Search .............................. 365/145, 189.09, 365/205, 207, 208, 190, 210

(56) References Cited

U.S. PATENT DOCUMENTS

| | | | |
|---|---|---|---|
| 4,873,664 | 10/1989 | Eaton, Jr. ............................. | 365/145 |
| 5,297,077 | * 3/1994 | Imai et al. ............................ | 365/145 |
| 5,388,084 | 2/1995 | Itoh et al. ............................. | 365/226 |
| 5,694,353 | * 12/1997 | Koike ................................... | 365/145 |
| 5,754,466 | * 5/1998 | Arase .................................... | 365/145 |
| 5,917,746 | * 6/1999 | Seyyedy ............................... | 365/145 |
| 5,926,413 | * 7/1999 | Yamada et al. ...................... | 365/145 |
| 5,995,406 | * 11/1999 | Kraus et al. .......................... | 365/145 |
| 6,028,783 | * 2/2000 | Allen et al. ........................... | 365/145 |
| 6,038,160 | * 3/2000 | Nakane et al. ....................... | 365/145 |

FOREIGN PATENT DOCUMENTS 7-192476    7/1995  (JP) .

OTHER PUBLICATIONS

Tatsumi Sumi et al.; "A 256 kb Nonvolatile Ferroelectric Memory at 3V and 100ns"; ISSCC 94, pp. 268–269.

* cited by examiner

Primary Examiner—Son Mai
(74) Attorney, Agent, or Firm—Banner & Witcoff, Ltd.

(57) ABSTRACT

A ferroelectric memory device includes a plate line driving circuit, dummy plate line driving circuit, constant voltage generator and variable voltage generating circuit. The plate line driving circuit pulse-drives a plate line associated with a memory cell selected at the time of data readout. The dummy plate line driving circuit pulse-drives a dummy plate line associated with a dummy cell connected to a reference bit line which makes a complementary pair with a bit line connected to the selected memory cell. The constant voltage generator generates a voltage which does not depend on an external power supply voltage and the temperature and is kept substantially constant and applies the voltage to the plate line driving circuit as a power supply voltage. The variable voltage generating circuit generates a plurality of substantially constant voltages which do not depend on an external power supply voltage and the temperature and applies a voltage selected from the plurality of voltage levels according to the high level or low level of the bit line to the dummy plate line driving circuit as a power supply voltage.

27 Claims, 11 Drawing Sheets

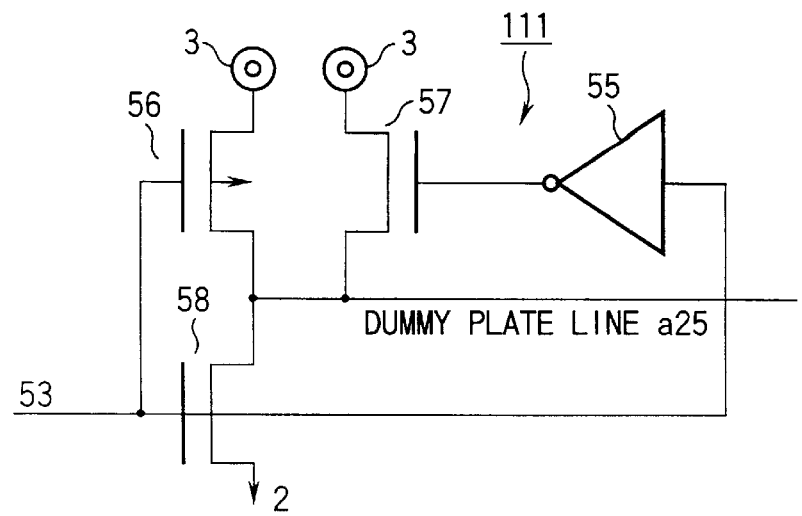
FIG. 8
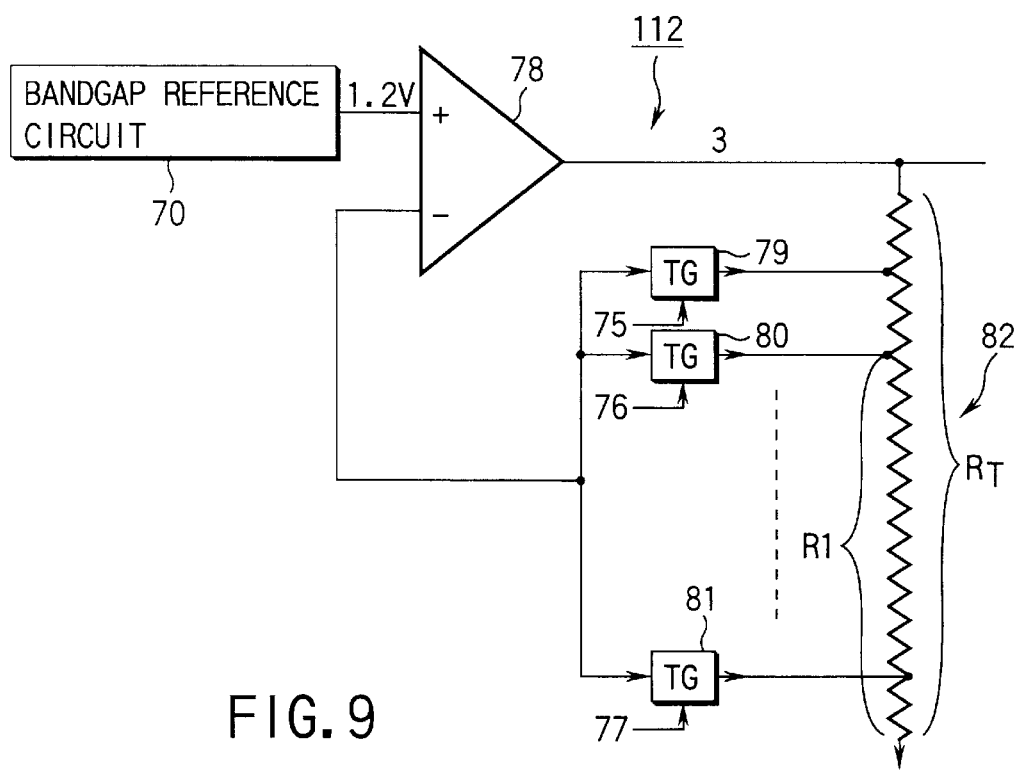
FIG. 9
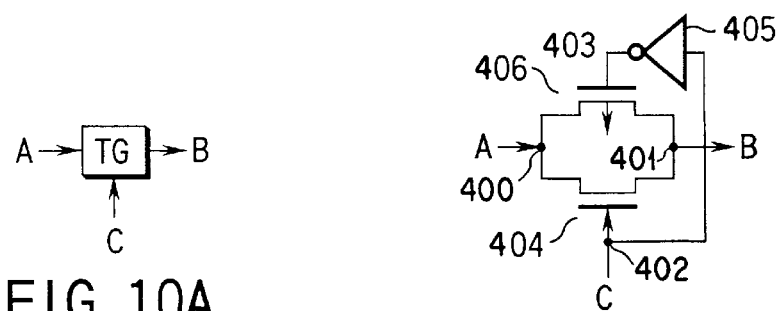
FIG. 10A
FIG. 10B

FERROELECTRIC MEMORY DEVICE

BACKGROUND OF THE INVENTION

This invention relates to a ferroelectric memory device for storing data according to the state of polarization of a ferroelectric film provided between electrodes of a capacitor and sensing a variation in the bit line potential according to the polarization state of the ferroelectric film to read out stored data.

The ferroelectric memory device is described in, for example, U.S. Pat. No. 4,873,664 Eaton, Jr., "Self Restoring Ferroelectric Memory", ISSCC 94, pp. 268 to 269, 1994 Tatsumi Sumi et al. "A 256 kb Nonvolatile Ferroelectric Memory at 3V and 100 ns" and the like.

A circuit section constructing the basic portion of the ferroelectric memory device is constructed as shown in FIG. 1, for example. In this example, main portions such as memory cells, dummy cells, sense and rewrite amplifier (sense amplifier) and peripheral circuit thereof are extracted and shown. Memory cells MC1, MC2 are respectively formed of ferroelectric capacitors 10, 11 and selection transistors 14, 15, and dummy cells DCa, DCb are respectively formed of ferroelectric capacitors 12, 13 and selection transistors 16, 17. A word line 19 on an i-th row is connected to the gate of the selection transistor 14 of the memory cell MC1 and a plate line 23 on the I-th row is connected to the plate electrode of the ferroelectric capacitor 10. Likewise, a word line 20 on an (i+1)th row is connected to the gate of the selection transistor 15 of the memory cell MC2 and a plate line 24 on the (i+1)th row is connected to the plate electrode of the ferroelectric capacitor 11. Further, a dummy word line a21 is connected to the gate of the selection transistor 16 of the dummy cell DCa and a dummy plate line a25 is connected to the plate electrode of the ferroelectric capacitor 12. In addition, a dummy word line b22 is connected to the gate of the selection transistor 17 of the dummy cell DCb and a dummy plate line b26 is connected to the plate electrode of the ferroelectric capacitor 13.

Ends of the current paths of the selection transistor 14 of the memory cell MC1 and the selection transistor 17 of the dummy cell DCb are connected to a bit line 27 and ends of the current paths of the selection transistor 15 of the memory cell MC2 and the selection transistor 16 of the dummy cell DCa are connected to a /bit line ("/" indicates a bar indicating inversion) 28. When the memory cell MC1 is selected, the dummy cell DCa is selected, a reference potential generated by the dummy cell DCa is applied to the /bit line 28 and the /bit line 28 is used as a reference bit line for detecting the high level or low level of the bit line 27. Further, when the memory cell MC2 is selected, the dummy cell DCb is selected, a reference potential generated by the dummy cell DCb is applied to the bit line 27 and the bit line 27 is used as a reference bit line for detecting the high level or low level of the /bit line 28.

The sense and rewrite amplifier (sense amplifier) 18 is connected between the paired bit lines 27 and 28 to amplify a potential difference between the paired bit lines 27 and 28. The paired bit lines 27 and 28 are respectively connected to common readout data line and /data line 303 and 304 via the current paths of transistors 300 and 301 for selecting a column. The gates of the transistors 300 and 301 are connected to a column selection line 302 and a signal amplified by the sense amplifier 18 of a column selected by a column selection signal supplied from a column decoder (not shown) is supplied to the common readout data line and /data line 303 and 304.

With the above construction, the directions of the electric field and polarization (the directions are the same) of the ferroelectric film of each of the ferroelectric capacitors 10 to 13 are defined as a positive direction if the direction is set from the plate lines 23, 24 and dummy plate lines 25, 26 to the bit lines 27, 28. In the ferroelectric memory device, a difference (low or high level) occurs in the potential level of the bit line 27 or 28 according to the polarization state (the direction of polarization) of the ferroelectric capacitor 10 or 11 which stores data. The stored data is read out by sensing and amplifying a difference between the potential level of the bit line 27 or 28 and the potential level of the reference bit line 28 or 27 by use of the sense amplifier 18. More specifically, as shown in the timing chart of FIG. 2, the potential of a to-be-selected bit line is previously set at 0 (V) and the potentials of a word line and plate line connected to a to-be-selected memory cell are raised to a high level to select the memory cell (time t1). Then, after the potential of the bit line is changed, the sense amplifier is activated (time t2) so as to set the bit line potential to a high or low level according to the direction of polarization of the ferroelectric capacitor. At this time, a reference potential is generated by selecting the dummy word line a21 when the word line 19 on the i-th row is selected and by selecting the dummy word line b22 when the word line 20 on the (i+1)th row is selected.

In this case, assume that the power supply voltage is 3 (V) and the maximum potential of the selected plate line is 3 (V). Further, assume that the maximum potential of the selected word line is boosted to a voltage (for example, 4.5 (V)) for compensating for a drop in the threshold voltage of the selection transistor so as to permit the high potential level of the bit line to be transmitted to the ferroelectric capacitor.

When the direction of polarization of the ferroelectric capacitor in the selected memory cell MC is an upward direction (from the plate line side to the bit line side), the polarization is not reversed since the directions of the electric field and polarization are the same. A variation in the polarization occurring in the cell at this time is shown in FIG. 3A. In this case, since the amount of charges discharged from the cell is small, the bit line potential level is low. On the other hand, when the direction of polarization is a downward direction (from the bit line side to the plate line side), the polarization is reversed since the directions of the electric field and polarization are opposite to each other. A variation in the polarization occurring in the cell at this time is shown in FIG. 3B. In this case, since the amount of charges discharged from the cell is large, the bit line potential level is high. Therefore, a level difference between the potentials of the paired bit lines 27 and 28 can be sensed by use of the sense amplifier 18 by generating a reference potential in a condition that the areas of the ferroelectric capacitors 12, 13 in the dummy cells DCa, DCb are set m (>1) times those of the ferroelectric capacitors 10, 11 in the memory cells MC1, MC2 and setting the potential of one of the bit lines which is used as a reference bit line to an intermediate level between the high and low potential levels of the other bit line from which data is read out. However, in this case, it is necessary to generate a driving pulse for the dummy word lines a21, b22 and dummy plate lines a25, b26 so that the ferroelectric capacitors 12, 13 of the dummy cells DCa, DCb will be always operated without polarization reversal.

In FIGS. 3A and 3B, the polarization becomes "0" when the voltage is set to one of two voltage levels which are each called a coercive voltage. When the voltage is set at "0", two polarization levels are present and they are called remnant polarization.

In the conventional ferroelectric memory device, it is known that the characteristic of the ferroelectric capacitor varies depending on the position in which the chip is formed in the wafer and the high level and low level of the bit line vary according to the polarization state. FIG. 4 shows the relation between the high level and low level of the bit line when chips are formed in different positions in the wafer. As is clearly seen from FIG. 4, the low level of the bit line varies in a range of approx. 200 (mV) from 0.92 (V) to 1.12 (V), the high level varies in a range of approx. 170 (mV) from 1.17 (V) to 1.34 (V), and variation rates of the high level and low level of the bit line are different. Therefore, when a reference potential is generated by use of the dummy cell, a margin between the reference potential and the high level or low level of the bit line from which data is read out becomes less and erroneous readout may occur if an attempt is made to generate a reference potential of the intermediate level between the high level and low level of the bit line simply by setting the areas of the ferroelectric capacitors 12, 13 for the dummy cells m (>1) times those of the ferroelectric capacitors 10, 11 for the memory cells. Further, even if the reference potential can be set to a constant value (constant reference potential) in all of the chips in the wafer as shown by broken lines in FIG. 4, an area in which a margin between the reference potential and the high level or low level of the bit line becomes less is provided and a reduction in the margin cannot be stably avoided.

Further, in the ferroelectric memory device, it is known that the dependency of the polarization of the ferroelectric capacitor on the plate voltage is different in the memory cells MC1, MC2 and the dummy cells DCa, DCb. In FIGS. 3A and 3B, the polarization with the potential of the plate line kept constant is shown, but in FIG. 5, the horizontal axis indicates a voltage of the plate line (power supply voltage) and the vertical axis indicates variation amounts (charge amounts) of polarization caused when the polarization reversal does not occur (low level) and when the polarization reversal occurs (high level) and a variation amount (charge amount) of polarization caused by the dummy cell. Since a difference between the high level and low level is proportional to a difference between the positive remnant polarization and the negative remnant polarization, it does not depend on the voltage of the plate line. Further, since the polarization reversal does not occur when the voltage of the plate line becomes equal to or lower than the coercive voltage, a difference in the charge amount between the high level and the low level does not occur as shown in FIG. 5. Since a variation amount of polarization caused by the dummy cell is set m (>1) times that obtained when the polarization reversal does not occur, it becomes the same as shown in FIGS. 3A and 3B.

As is clearly seen from FIG. 5, the dependency on the plate voltage is different in the polarization of the ferroelectric capacitor of the memory cell and the polarization of the ferroelectric capacitor of the dummy cell. When the product is actually used, a fluctuation (variation) in the power supply voltage is permitted to some extent. For example, in the power supply normally called a 3V power supply, a fluctuation from 2.7 (V) to 3.6 (V) is permitted for actual usage. Generally, since the plate voltage is equal to the power supply voltage, the plate voltage also fluctuates in the above range. As is understood from FIG. 5, a difference between the charge amount in the dummy cell and the charge amount in the case of low level set when the polarization reversal does not occur is small in the low power supply voltage range, but a difference between the charge amount in the dummy cell and the charge amount in the case of high level becomes small in the high power supply voltage range. For this reason, a margin for data readout becomes insufficient and a problem that the sense operation becomes unstable and erroneous data readout occurs may occur.

BRIEF SUMMARY OF THE INVENTION

Accordingly, an object of this invention is to provide a ferroelectric memory device capable of attaining a sufficiently large margin between the reference potential and the high level or low level and preventing erroneous data readout even if the high level and low level of the bit line fluctuate depending on the position in which the chip is formed in the wafer.

Further, another object of this invention is to provide a ferroelectric memory device capable of preventing a potential difference between a to-be-sensed bit line and a reference bit line from fluctuating depending on the power supply voltage and preventing erroneous data readout.

The above object of this invention can be attained by a ferroelectric memory device comprising means for setting a potential of a bit line to one of a high level and low level according to the direction of polarization of a ferroelectric film; means for applying a reference potential to a reference bit line which makes a complementary pair with the bit line; means for comparing the potential of the bit line with the reference potential of the reference bit line and sensing and rewriting stored data; and means for selecting and setting the reference potential from a plurality of potential levels according to the high level and low level of the bit line.

With the above construction, since the reference potential set by the means for setting the reference potential is variable and the reference potential can be set according to the high level and low level of the bit line and applied to the reference bit line, an optimum reference potential can be set for each chip even if the high levels and low levels of the bit lines are different between wafers. Therefore, a sufficiently large margin can be attained between the reference potential and the high level or low level of the bit line and erroneous data readout can be prevented. As a result, a stable sense and readout operation can be attained.

Further, the above object of this invention can be attained by a ferroelectric memory device for reading out a high level or low level corresponding to the direction of polarization of a ferroelectric film from a memory cell to a bit line, applying a reference potential from a dummy cell to a reference bit line which makes a complementary pair with the bit line and comparing the potential of the bit line with the reference potential of the reference bit line to sense and rewrite stored data, comprising a plate line driving circuit for pulse-driving a plate line associated with a memory cell selected at the time of data readout; a dummy plate line driving circuit for pulse-driving a dummy plate line associated with a dummy cell connected to a reference bit line which makes a complementary pair with a bit line connected to the selected memory cell; a bandgap reference circuit for applying a power supply voltage to the plate line driving circuit and dummy plate line driving circuit; an operational amplifier supplied with an output voltage of the bandgap reference circuit at a non-inverting input terminal thereof; a voltage dividing circuit for dividing the potential of the output terminal of the operational amplifier and supplying the divided potential to an inverting input terminal of the operational amplifier; and a constant voltage generator for outputting a potential of the output terminal of the operational amplifier.

With the above construction, since the high level and low level of the bit line to be sensed and the reference potential of the reference bit line are not changed depending on the external power supply voltage and the temperature, erroneous data readout caused by a variation in the external power supply voltage and a variation in the temperature can be prevented and a stable sense and readout operation can be attained.

Further, the above object of this invention can be attained by a ferroelectric memory device for reading out a high level or low level corresponding to the direction of polarization of a ferroelectric film from a memory cell to a bit line, applying a reference potential from a dummy cell to a reference bit line which makes a complementary pair with the bit line and comparing the potential of the bit line with the reference potential of the reference bit line to sense and rewrite stored data, comprising a plate line driving circuit for fixedly driving a plate line associated with a memory cell selected; a dummy plate line driving circuit for fixedly driving a dummy plate line associated with a dummy cell connected to a reference bit line which makes a complementary pair with a bit line connected to the selected memory cell; a bandgap reference circuit for applying a power supply voltage to the plate line driving circuit and dummy plate line driving circuit; an operational amplifier supplied with an output voltage of the bandgap reference circuit at a non-inverting input terminal thereof; a voltage dividing circuit for dividing the potential of the output terminal of the operational amplifier and supplying the divided potential to an inverting input terminal of the operational amplifier; and a constant voltage generator for outputting a potential of the output terminal of the operational amplifier.

With the above construction, since the high level and low level of the bit line to be sensed and the reference potential of the reference bit line are not changed depending on the external power supply voltage and the temperature, erroneous data readout caused by a variation in the external power supply voltage and a variation in the temperature can be prevented and a stable sense and readout operation can be attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a circuit diagram for illustrating an example of the construction of a dummy plate line driving circuit in the circuit shown in FIG. 6;

FIG. 9 is a circuit diagram showing an example of the construction of a variable voltage generating circuit for applying a power supply voltage to the dummy plate line driving circuit shown in FIG. 8;

FIG. 10A is a symbol diagram for illustrating an example of the construction of a transfer gate in the circuit shown in FIG. 9;

FIG. 10B is a circuit diagram of FIG. 10A, for illustrating an example of the construction of a transfer gate in the circuit shown in FIG. 9;

DETAILED DESCRIPTION OF THE INVENTION

Figure 6:
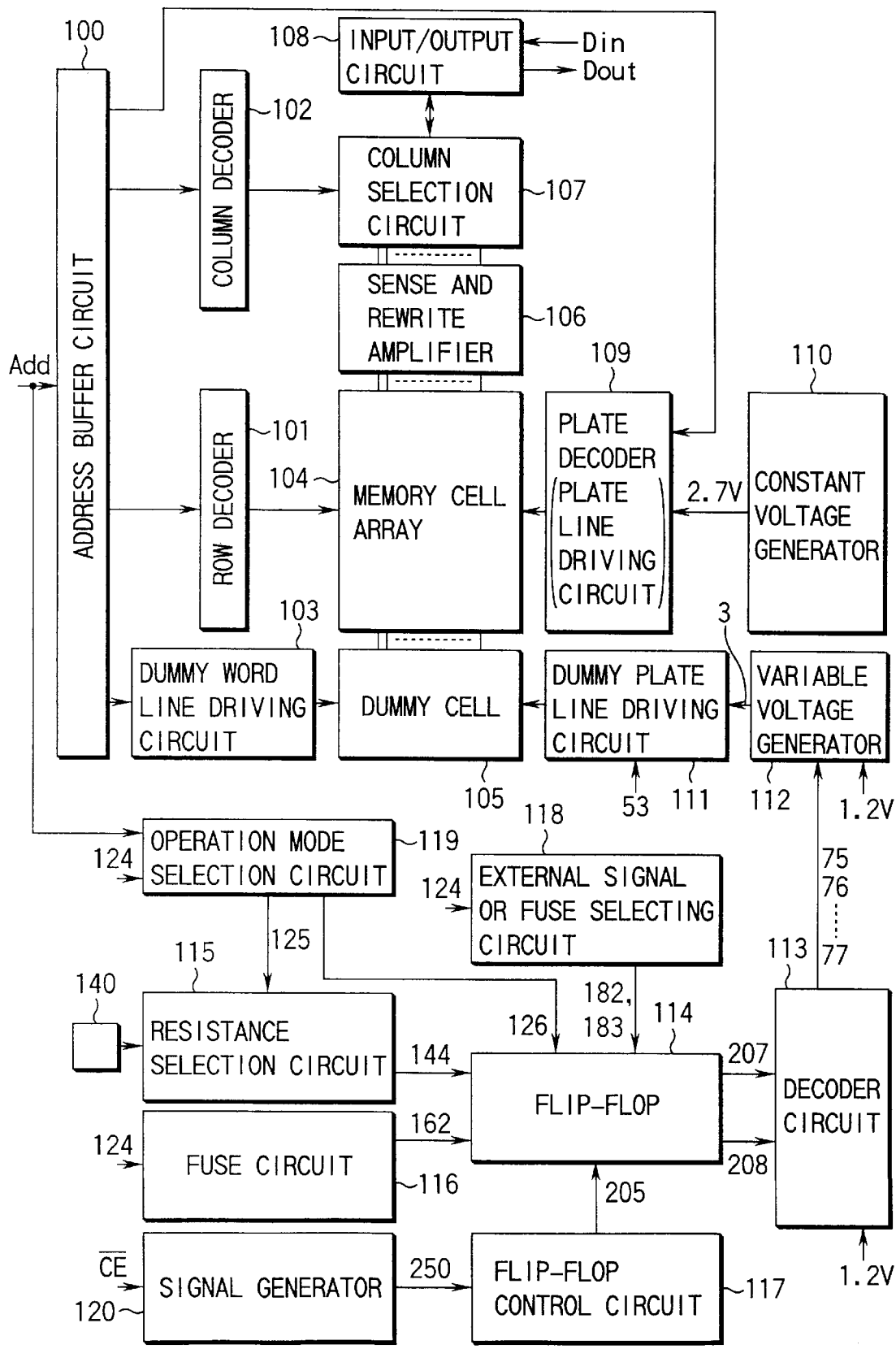
FIG. 6 is a block diagram showing the schematic construction of a ferroelectric memory device according to a first embodiment of this invention.

FIG. 6 is a block diagram showing the schematic construction of a ferroelectric memory device according to a first embodiment of this invention. An address signal Add is supplied to an address buffer circuit 100 and output signals of the address buffer circuit 100 are respectively supplied to a row decoder 101, column decoder 102, dummy word line driving circuit 103 and plate decoder (plate line driving circuit) 109. A decoded output of the row decoder 101 is supplied to a memory cell array 104 and an output of the dummy word line driving circuit 103 is supplied to a dummy cell 105. A sense and rewrite amplifier 106 and a column selection circuit 107 are provided for each bit line pair of the memory cell array 104 and a decoded output of the column decoder 102 is supplied to the column selection circuit 107. Data read out from the memory cell array 104 is sensed and amplified by the sense and rewrite amplifier (sense amplifier) 106 and data of a selected column is supplied to an input/output circuit 108 via the column selection circuit 107 and output as readout data Dout. Further, write data Din is supplied to the input/output circuit 108 and written into a selected memory cell in the memory cell array 104 via the column selection circuit 107 and sense amplifier 106.

An output signal of the plate decoder 109 is supplied to the plate electrode of a ferroelectric capacitor in the memory cell array 104 and a constant voltage (2.7V) output from a constant voltage generator 110 is supplied as a power supply voltage of the plate decoder 109. An output signal of a dummy plate line driving circuit 111 is supplied to the dummy cell 105 and a voltage 3 generated from a variable voltage generating circuit 112 is supplied to the dummy plate line driving circuit 111. The variable voltage generating circuit 112 outputs a voltage of a different level according to output signals 75, 76, . . . , 77 of a decoder circuit 113. The decoder circuit 113 selects an optimum output voltage by decoding output signals 207, 208 of a flip-flop 114 and selecting a voltage dividing ratio of a voltage dividing circuit in the variable voltage generating circuit 112. The flip-flop 114 is supplied with an output signal 144 of a resistance selection circuit 115, an output signal 162 of a fuse circuit 116, an output signal 205 of a flip-flop control circuit 117 and output signals 182, 183 of a selection circuit 118 for selecting an external signal or fuse. The resistance selection circuit 115 is supplied with a signal from an external terminal (pad) 140 and an output signal 126 of an operation mode selection circuit 119. The operation mode selection circuit 119 is supplied with the address signal Add. Further, a signal 124 is supplied to the operation mode selection circuit 119, fuse circuit 116 and external signal/ fuse selection circuit 118. The flip-flop control circuit 117 is supplied with an output signal 250 of a signal generating circuit 120. The signal generating circuit 120 generates a timing signal 250 based on a chip enable signal /CE.

Figure 1:
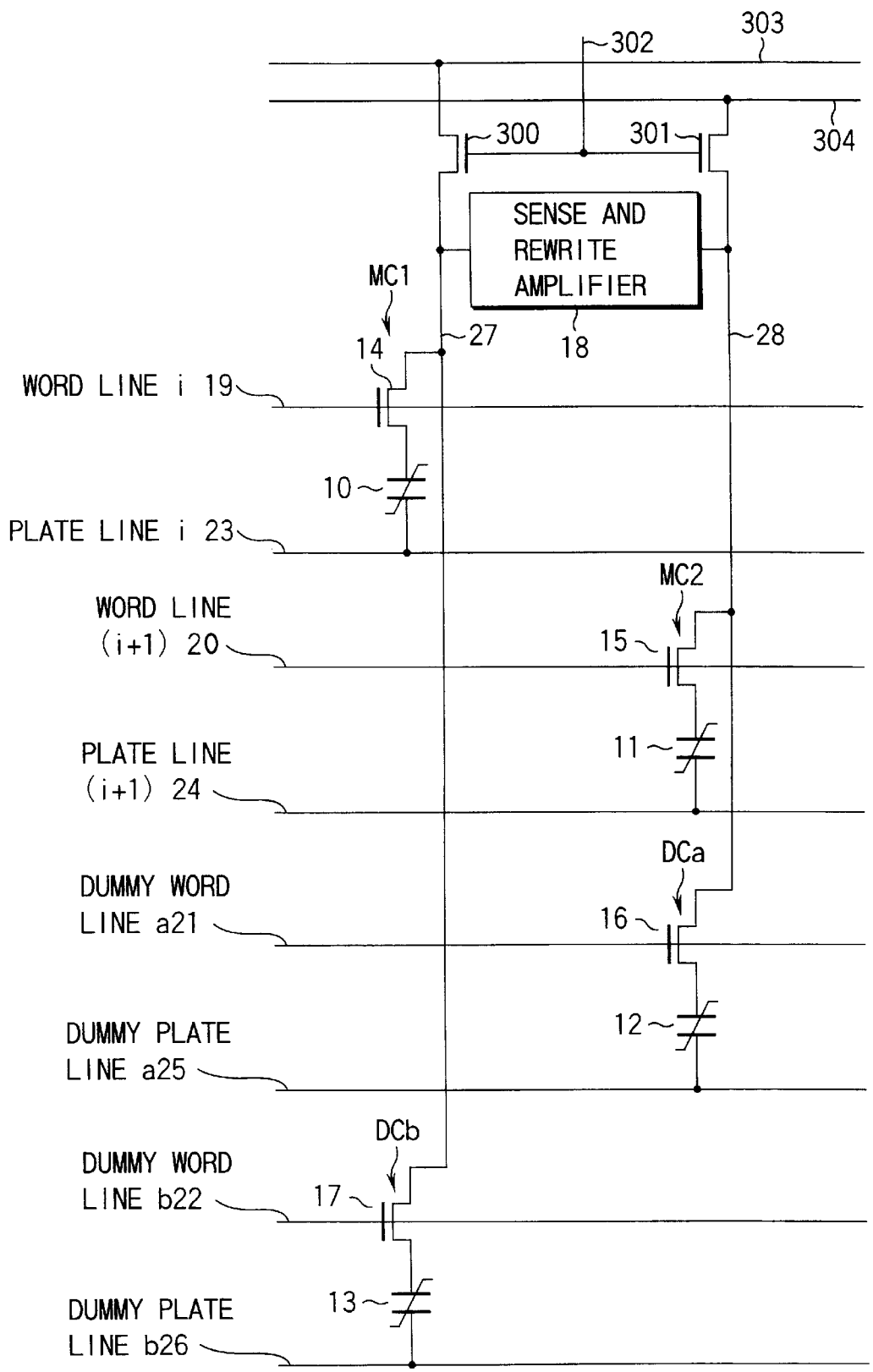
FIG. 1 is a circuit diagram showing the extracted main portion of the basic construction, for illustrating the conventional ferroelectric memory device.
Figure 2:
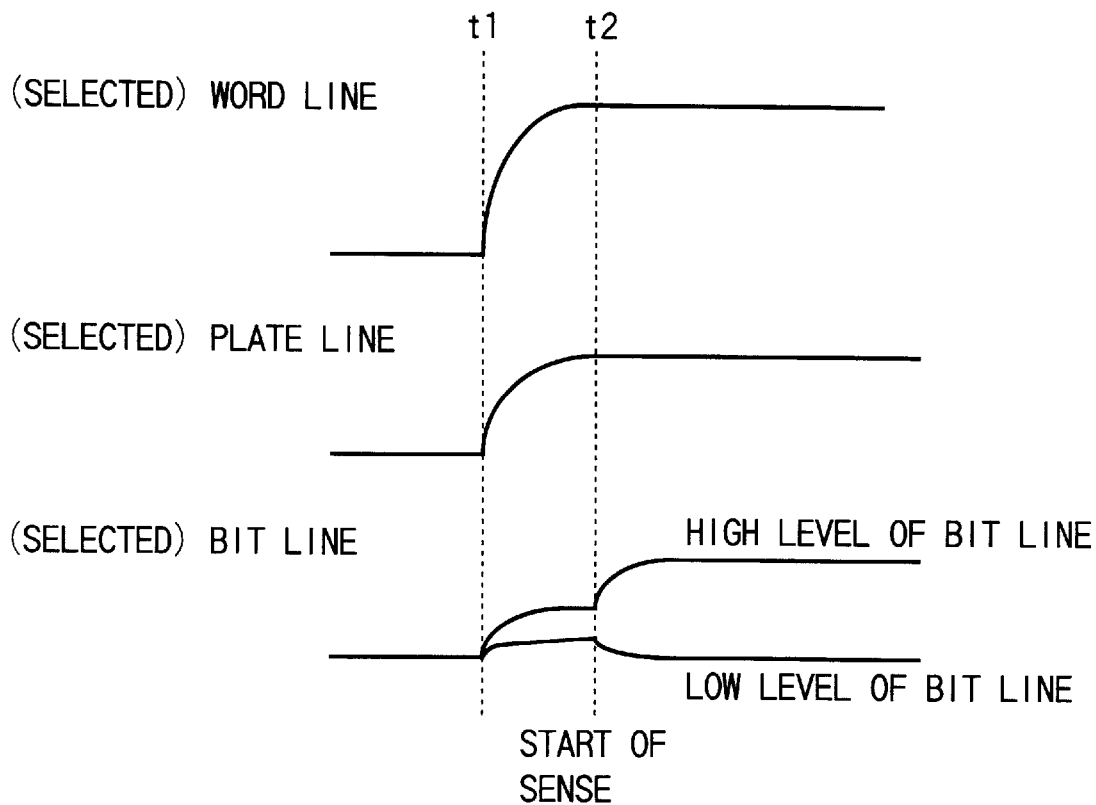
FIG. 2 is a timing chart for illustrating the data readout operation in the circuit shown in FIG. 1.
Figure 7:
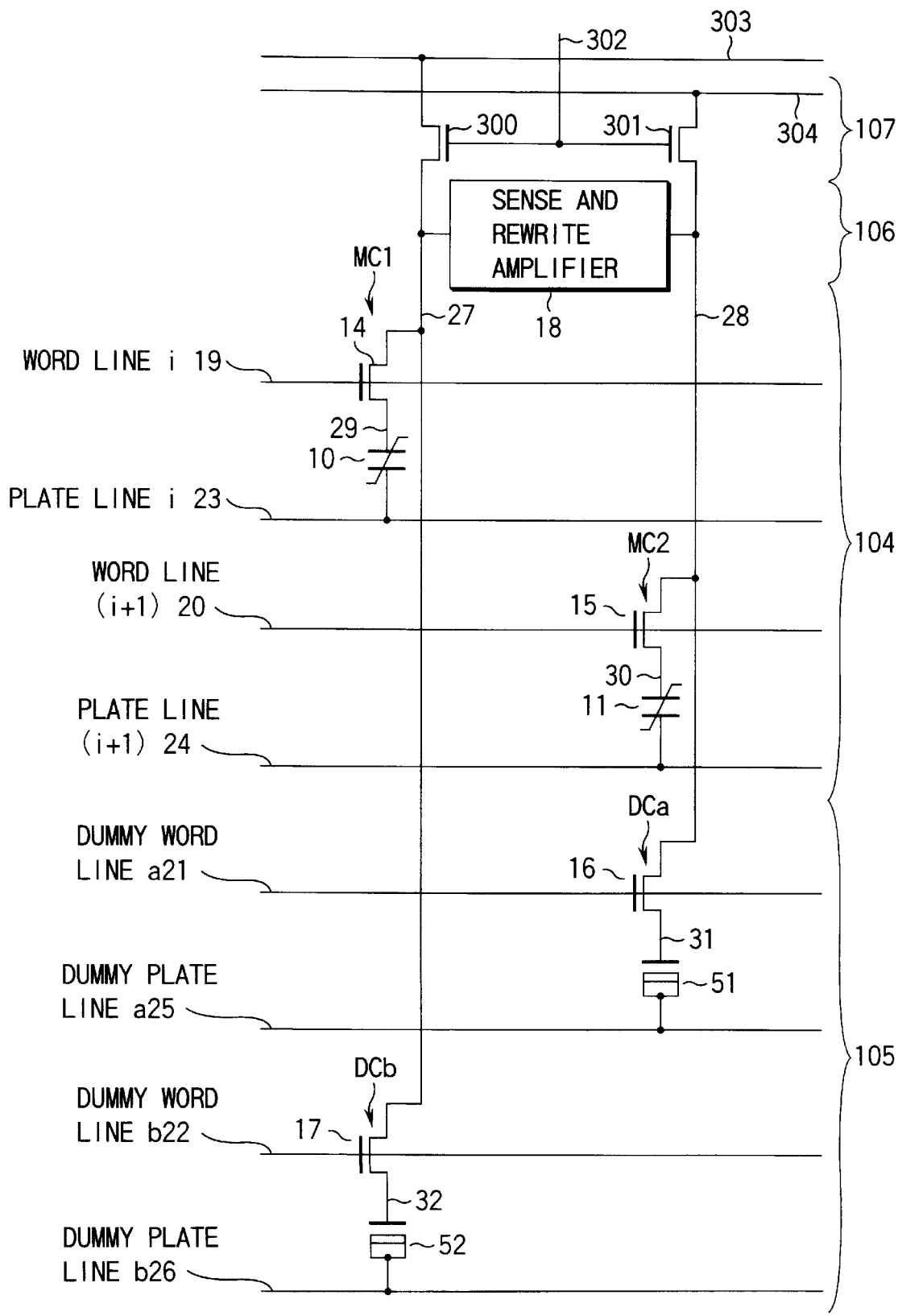
FIG. 7 is a circuit diagram showing an example of the construction of the main portion of a memory cell array, dummy cell, sense and rewrite amplifier and column selection circuit shown in FIG. 6.

FIG. 7 is a circuit diagram showing an example of the construction of the main portion of a memory cell array, dummy cells, sense and rewrite amplifier and column selection circuit shown in FIG. 6. The memory cell array 104, sense and rewrite amplifier 106 and column selection circuit 107 are similar to those of the conventional ferroelectric memory device shown in FIG. 1, the same portions are denoted by use of the same reference numerals and the detail explanation thereof is omitted. The circuit section is similar to the conventional ferroelectric memory device except that dummy cells DCa, DCb for generating a reference potential are provided. That is, the dummy cell DCa is constructed by a selection transistor 16 and a dummy capacitor 51, the dummy cell DCb is constructed by a selection transistor 17 and a dummy capacitor 52, and a linear capacitor utilizing the gate oxide film of a MOS transistor is used for the dummy capacitors 51, 52. In order to attain the linearity of the dummy capacitors 51, 52, a depletion MOS transistor having phosphorus or arsenic doped into the channel region is used. Unlike the ferroelectric film, the gate oxide film has a feature that it is not wear out even if the readout operation is effected many times and it is not practically degraded even if it is left at high temperatures. The electrostatic capacitance of each of the dummy capacitors 51, 52 is CD, the parasitic capacitance of the bit line is CB and the potential of each of the dummy plate lines 25, 26 is VDP, then the reference potential VR of the bit line is expressed as follows.

$$V_R = C_D \times V_{DP}/(C_D + C_B) \tag{1}$$

Therefore, the reference potential can be changed by changing the potentials of the dummy plate lines a25, b26.

FIG. 8 shows a circuit section for driving the dummy plate line a25 connected to the dummy capacitor 51, for illustrating an example of the construction of the dummy plate line driving circuit 111 in the circuit shown in FIG. 6. A circuit section for driving the dummy plate line b26 is formed with the same construction. The circuit includes a P-channel MOS (PMOS) transistor 56, N-channel MOS (NMOS) transistors 57, 58 and inverter 55. The source of the load transistor 56 is connected to the power supply 3, the source of the driving transistor 58 is connected to the ground node 2 and the gates and the drains of the transistors 56 and 58 are respectively connected together to constitute an inverter. The gates of the transistors 56, 58 are supplied with a control signal 53 and the signal 53 is inverted and then supplied to the dummy plate line a25. The high level of the dummy plate line a25 can be changed by changing the level of the power supply voltage 3 applied to the inverter. However, if the level of the power supply voltage 3 is lowered, the current driving ability of the load transistor 56 is lowered. Therefore, in order to compensate for a lowering in the current driving ability occurring in the above case, a load transistor 57 is connected in parallel with the load transistor 56 and it is driven by an inverted signal obtained by inverting the signal 53 by the inverter 55. The load transistors 56, 57 and inverter 55 construct a transfer gate which connects the power supply 3 to the dummy plate line a25 according to the signal 53. A lowering in the current driving ability due to the lowering in the level of the power supply 3 can be compensated for by driving the dummy plate line a25 by use of the transfer gate.

FIG. 9 shows the variable voltage generating circuit 112 for applying the power supply voltage 3 to the dummy plate line driving circuit 111 shown in FIG. 8. The circuit 112 includes a bandgap reference circuit 70, operational amplifier 78, voltage dividing circuit 82 and transfer gates 79, 80, . . . , 81. If a voltage higher than a voltage applied to the inverting input terminal (−) of the operational amplifier 78 is input to the non-inverting input terminal (+) thereof, an output voltage of the operational amplifier 78 (the potential of the power supply 3) is lowered and if a lower voltage is input, the output voltage of the operational amplifier 78 is raised. The operational amplifier 78 can be easily realized by use of a CMOS type current mirror circuit, for example. An output voltage of the bandgap reference circuit 70 is applied to the non-inverting input terminal (+) of the operational amplifier 78. The output voltage of the bandgap reference circuit 70 is approx. 1.2V and does not depend on a variation in the temperature and the external power supply voltage. The voltage dividing circuit 82 is provided between the output terminal and the inverting input terminal (−) of the operational amplifier 78. The potential of the inverting input terminal (−) of the operational amplifier 78 is determined by dividing the potential of the output terminal thereof by use of resistors of the voltage dividing circuit 82 and the potential (power supply voltage 3) of the output terminal can be freely set by changing the ratio between the resistance ($R_T$–$R_1$) and the resistance $R_1$ of the voltage dividing circuit 82.

Since $$\text{the potential of the inverting input terminal } (-) = \{(R_T - R_1) \times (\text{the potential of the output terminal})\}/R_1 \quad (2)$$

The potential (power supply voltage 3) of the output terminal thereof is lowered if the potential of the inverting input terminal (−) of the operational amplifier 78 tends to become higher than the potential of the non-inverting input terminal (+) even a bit, and as a result, the potential of the inverting input terminal (−) is lowered. If the potential of the inverting input terminal (−) becomes lower than the potential of the non-inverting input terminal (+), the potential of the inverting input terminal (−) tends to increase. As a result, the potential of the inverting input terminal (−) is fixed at the potential (1.2V) of the non-inverting input terminal (+) and the potential of the inverting input terminal (−) is constantly set at 1.2V. As shown in FIG. 9, if the resistance RT of the voltage dividing circuit 82 is set at a constant value and the resistance $R_1$ is changed by selectively controlling the ON/OFF states of the transfer gates 79, 80, 81, the potential (the potential of the power supply voltage 3) of the output terminal is set to $R_1/R_T \times 1.2V$ and can be freely set. Further, since the voltage dividing circuit 82 is formed of the resistors, a variation in the voltage dividing ratio due to a fluctuation in the manufacturing process and the temperature characteristic can be made small.

FIGS. 10A and 10B are diagrams for illustrating an example of the construction of the transfer gates 79, 80, . . . , 81 in the circuit shown in FIG. 9, and FIG. 10A is a symbol diagram and FIG. 10B is a detail circuit diagram of FIG. 10A. Each of the transfer gates 79, 80, . . . , 81 is constructed by an NMOS transistor 404, PMOS transistor 406 and inverter 405. When the potential of a node 402 is set at a high level, the NMOS transistor 404 is made conductive. Since the potential of a node 403 is set to a low level by the inverter 405, the PMOS transistor 406 is also made conductive. Therefore, a path between nodes 400 and 401 is made conductive. On the other hand, if the potential of the node 402 is set at the low level, the path between the nodes 400 and 401 is made nonconductive.

Figure 11:
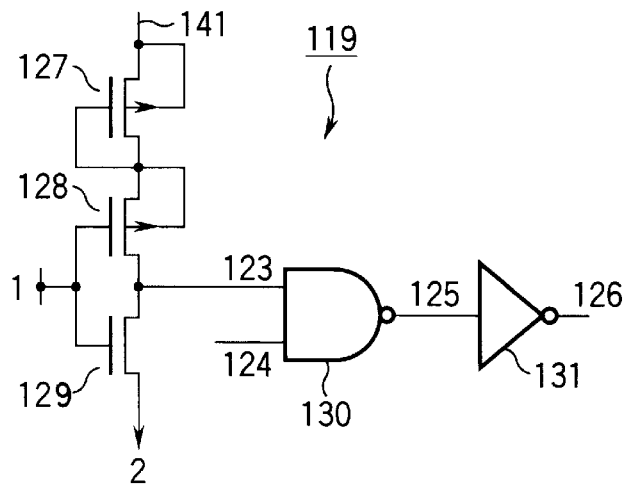
FIG. 11 is a circuit diagram showing an example of the construction of an operation mode selection circuit for setting an operation mode for selecting a resistance.

Selection of the resistance $R_1$ by the transfer gates 79, 80, . . . , 81 is made according to the characteristic of the ferroelectric capacitor which varies depending on the position in which the chip is formed in the wafer. FIG. 11 shows an example of the construction of the operation mode selection circuit 119 for setting an operation mode for making the above selection. The circuit includes PMOS transistors 127, 128, NMOS transistor 129, NAND gate 130 and inverter 131. In order to set the operation mode for making the selection, it is necessary to apply a voltage higher than a voltage of the external power supply 1 to a pad 141. If a voltage higher than the voltage of the external power supply 1 by at least an amount corresponding to the sum of the threshold voltages of the PMOS transistors 127 and 128 is applied to the pad 141, the potential level of the node 123 becomes high since the PMOS transistors 127 and 128 are both made conductive. If a voltage of a relatively high level is already applied to the pad 141 when the external power supply voltage 1 is low at the time of turn-ON of the power supply in the normal operation, the potential of the node 123 is determined to be set at the high level by the next-stage NAND gate 130 and there occurs a possibility that it is erroneously determined to be a test mode. Therefore, a signal 124 of low level is input at the time of turn-ON of the power supply to set the potential of the node 125 to the high level and set the potential of the node 126 to the low level so as to prevent the above erroneous operation.

Further, the same function can be attained by using an additional pad for specifying the operation mode for selecting the resistance $R_1$ in addition to the normal pad.

Figure 12:
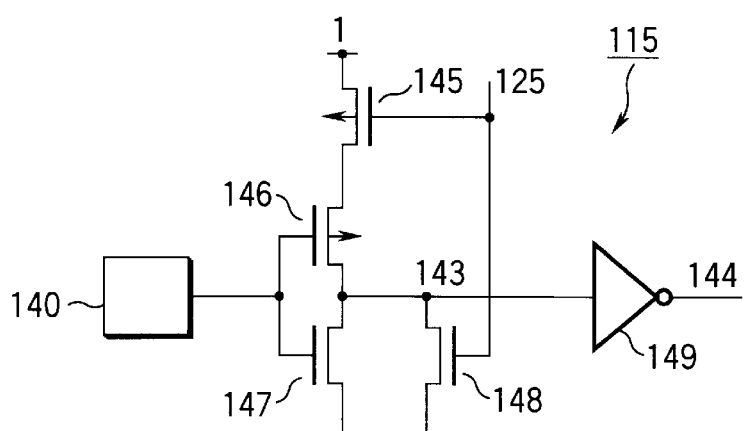
FIG. 12 is a circuit diagram showing an example of the construction of a resistor selection circuit supplied with a signal for selecting a resistance.

FIG. 12 shows a resistance selection circuit 115 supplied with a signal for selecting the resistance $R_1$. The circuit 115 includes PMOS transistors 145, 146, NMOS transistors 147, 148 and inverter 149 and a necessary number of circuits having the same construction as the circuit of FIG. 12 are provided. A signal necessary for selecting the resistance $R_1$ is input to the pad 140. In this example, if the operation mode for selecting the resistance $R_1$ is set, the output signal (node) 125 of the operation mode selection circuit 119 is set to the low level, the MOS transistor 145 is set in the ON state, the MOS transistor 148 is set in the OFF state and a signal which is the same as the signal input to the pad 140 is output as the output signal 144. On the other hand, if the output signal 125 of the operation mode selection circuit 119 is set to the high level, the MOS transistor 145 is set in the OFF state, the MOS transistor 148 is set in the ON state and a signal which is input to the pad 140 is not output as the output signal 144.

Figure 13:
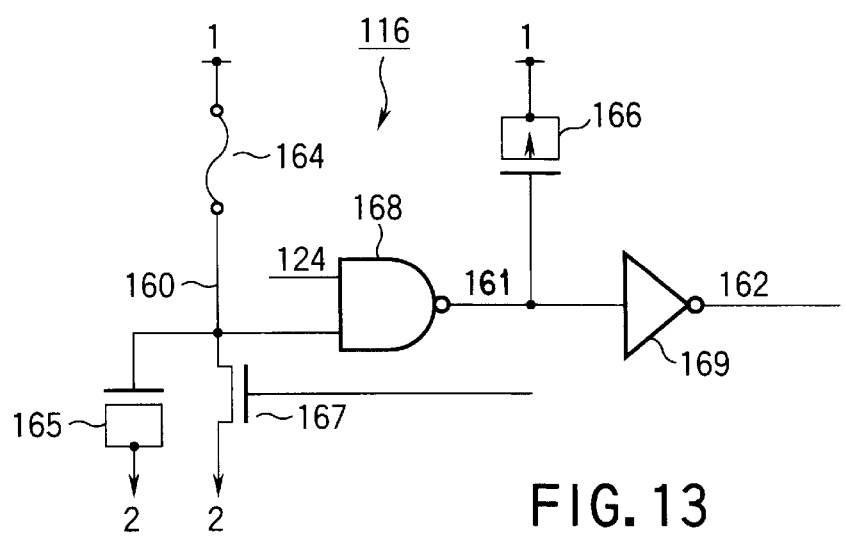
FIG. 13 is a circuit diagram showing an example of the construction of a fuse circuit for storing a resistance.

FIG. 13 shows a fuse circuit 116 for storing the resistance $R_1$ by cutting off the fuse after the resistance $R_1$ to be selected is determined. The circuit 116 includes a fuse 164, NMOS capacitor 165, PMOS capacitor 166, NMOS transistor 167, NAND gate 168 and inverter 169 and a necessary number of circuits having the same construction of the circuit of FIG. 13 are prepared. The signal 124 is normally set at the high level and set at the low level at the time of turn-ON of the power supply. Therefore, if the fuse 164 is not blown out (or not cut off), the node 160 is charged by the external power supply 1 and the potential thereof is set to the high level, the potential of the node 161 is set to the low level, and the output signal 162 is set to the high level. Further, if the fuse 164 is blown out, the node 160 is discharged and the potential thereof is set to the low level, and as a result, the potential of the node 161 is set to the high level and the output signal 162 is set to the low level.

Figure 14:
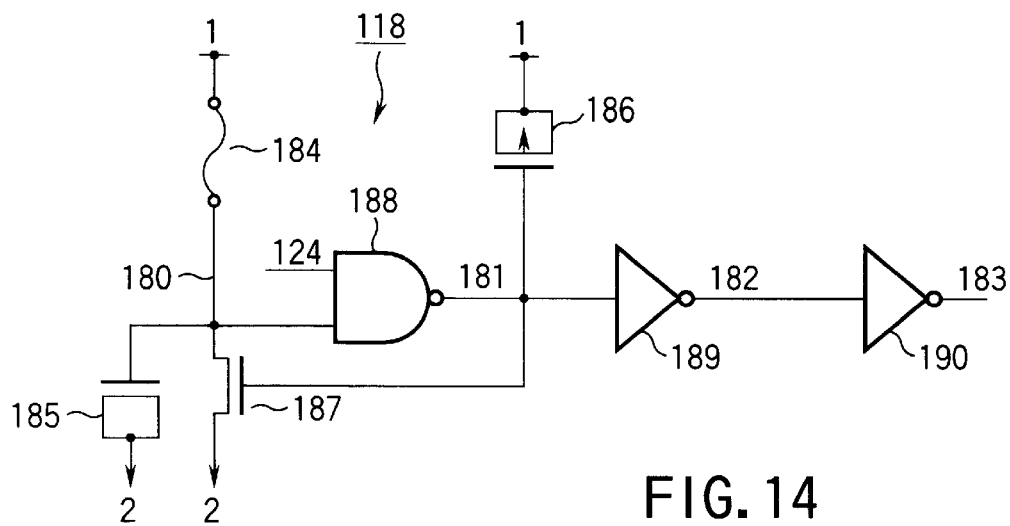
FIG. 14 is a circuit diagram showing an example of the construction of a selection circuit for a fuse or an external signal in the circuit shown in FIG. 6.

FIG. 14 shows a circuit for outputting a signal for determining whether a to-be-selected resistance is specified by an external signal such as an address signal or a to-be-selected resistance is determined to specify the resistance set in the circuit of FIG. 13 and the circuit corresponds to the external signal/fuse selection circuit 118 in the circuit shown in FIG. 6. The circuit 118 includes a fuse 184, NMOS capacitor 185, PMOS capacitor 186, NMOS transistor 187, NAND gate 188 and inverters 189, 190. When a to-be-selected resistance is specified by use of an external signal, the fuse 184 is not blown out so that a signal 183 will be set at the low level, and after the resistance is determined and the fuse 184 is blown out, the signal 183 is set to the high level.

In the circuits shown in FIGS. 13 and 14, the potentials of the nodes 160 and 180 tend to be set to the high level by the fuses and the potentials of the fuses 161 and 181 tend to be set to the low level before the fuses 164 and 184 are blown out. On the other hand, after the fuses 164 and 184 are blown out, the NMOS capacitors 165 and 185 tend to set the potentials of the nodes 160 and 180 to the low level and the PMOS capacitors 166 and 186 tend to set the potentials of the nodes 161 and 181 to the high level when the voltage of the external power supply 1 rises. After the fuses 164 and 184 are blown out and if the fuse is not completely blown out and a leakage current flows, a current flowing through the capacitor 166 or 186 becomes smaller and an expected operation cannot be attained in some cases when the external power supply 1 is extremely slowly turned ON. Therefore, if the signal 124 is set to the low level at the time of turn-ON of the power supply, the potentials of the nodes 161 and 181 are set to the high level and the potentials of the nodes 160 and 180 are set to the low level even if the capacitors 166 and 186 are not operated, and thus, the above problem can be solved.

Figure 15:
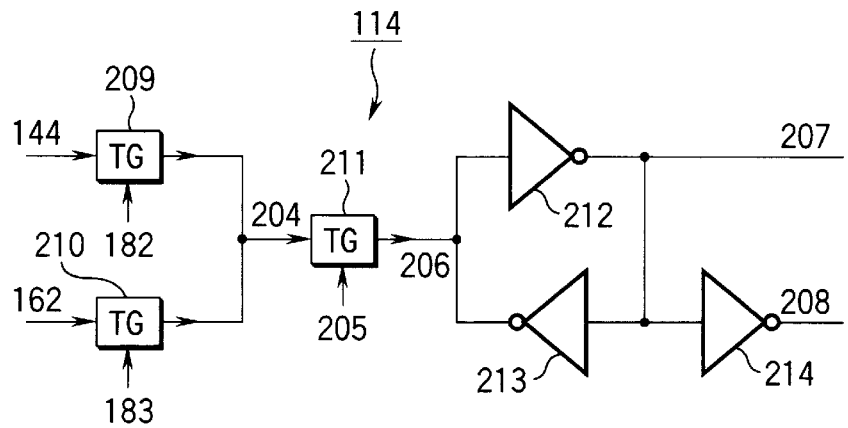
FIG. 15 is a circuit diagram showing an example of the construction of a flip-flop for informing the succeeding stage of whether the resistance selection is effected by use of an external signal or a signal generated by cutting off the fuse and switching the state thereof.

FIG. 15 shows the flip-flop 114 for informing the succeeding stage of whether the resistance selection is made by use of an external signal or a signal generated by cutting off the fuse and switching the state thereof. The flip-flop 114 includes transfer gates 209, 210, 211 and inverters 212, 213, 214. The transfer gates 209, 210, 211 are formed with the same construction as those shown in FIGS. 10A and 10B. Further, the input terminal and output terminal of the inverter 212 are respectively connected to the output terminal and input terminal of the inverter 213 to constitute a latch circuit. If the fuse 184 in the circuit of FIG. 14 is not blown out, a signal 182 is set to the high level and a signal 183 is set to the low level so that an external input signal 144 will appear on a node 204 via the transfer gate 209 before the fuse is blown out. If the fuse 184 is blown out, the signal 182 is set to the low level and the signal 183 is set to the high level so that an output signal 162 in the circuit of FIG. 13 will appear on the node 204 via the transfer gate 210. The potential of the node 204 is controlled by use of the signal 205 and stored in the latch circuit constructed by the inverters 212 and 213 and it is output as a signal 207 and inverted by the inverter 214 and then output as a signal 208.

Figure 16:
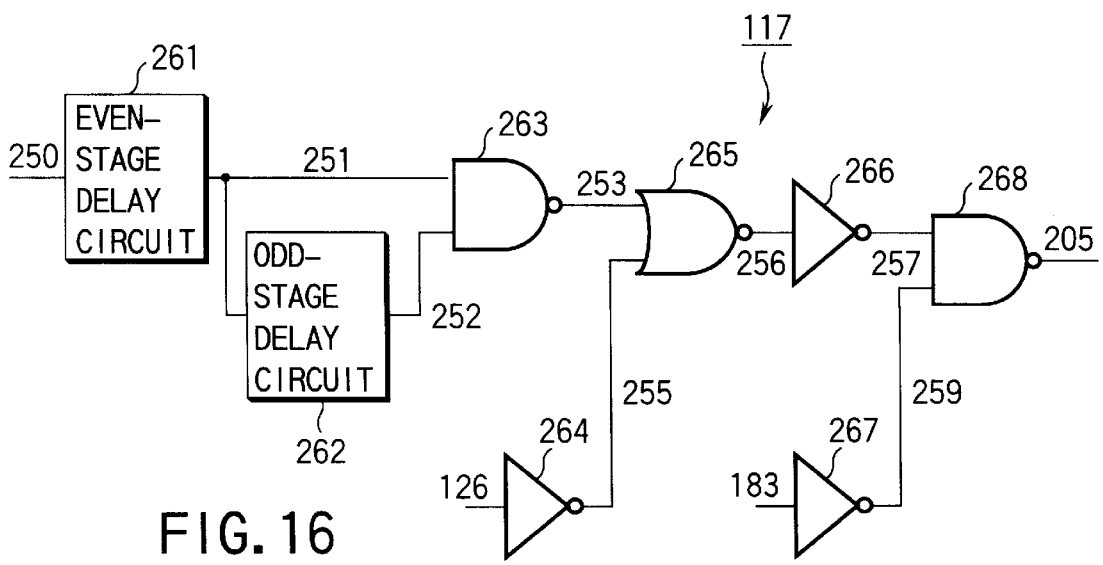
FIG. 16 is a circuit diagram showing an example of the construction of a flip-flop control circuit for generating a signal for controlling a transfer gate in the circuit shown in FIG. 15.

FIG. 16 shows the flip-flop control circuit 117 for generating a signal 205 for controlling the transfer gate 211 in the circuit shown in FIG. 15. The circuit includes an even-inverters delay circuit 261, odd-inverters delay circuit 262, NAND gate 263, inverter 264, NOR gate 265, inverters 266, 267 and NAND gate 268. First, a state set before the fuses are blown out is explained. In this state, since the output signal 183 of the selection circuit 118 of FIG. 14 is set at the low level, an output signal 259 of the inverter 267 is set to the high level. Therefore, the NAND gate 268 outputs an inverted signal of the output signal 257 of the inverter 266 as an output signal 205. If the voltage applied to the node 141 of the resistance selection circuit 115 shown in FIG. 11 is set sufficiently higher than the power supply voltage, the output signal (node) 126 of the circuit is set to the high level, and therefore, the output signal 255 of the inverter 264 is set to the low level. As a result, the NOR gate 265 outputs the inverted signal of the output signal 253 of the NAND gate 263 as an output signal 256.

Figure 17:
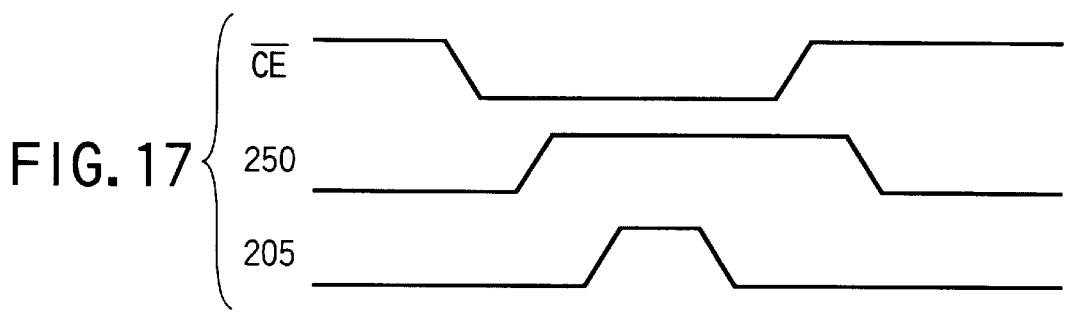
FIG. 17 is a timing chart for illustrating the function of a signal generating circuit in the circuit shown in FIG. 6.

FIG. 17 is a timing chart of the main signals obtained at this time, for illustrating the function of the signal generating circuit 120 in the circuit shown in FIG. 6. As shown in FIG. 17, if a chip enable signal /CE is set to the low level to select a chip, a signal 250 for activating the address buffer circuit 100 is set to the high level with a slight delay time. The signal 250 generates a pulse signal 205 which rises with a slight delay time by the even-inverters delay circuit 261 of FIG. 16 and falls after the elapse of time determined by the odd-inverters delay circuit 262. Therefore, the signal 144 which is the same as the signal input to the pad 140 in the circuit of FIG. 12 is stored into the latch circuit constructed by the inverters 212 and 213 of FIG. 15 while the signal 205 is kept at the high level. After this, if the signal applied to the node 141 of FIG. 11 is set back to the normal potential, the normal operation can be effected while information specifying the resistance is kept stored in the flip-flop. At this time, it is possible to determine whether the selected resistance $R_1$ is suitable or not by comparing the signal of the memory cell with the signal of the dummy cell. If the suitable resistance is thus determined, the fuse 184 of FIG. 14 is selectively blown out. At this time, since the output signal 183 of the external signal/fuse selection circuit 118 is set to the high level, the potential of the node 259 is set to the low level and the potential of the node 205 is set to the high level irrespective of the signal of the node 257. The signal 162 stored according to whether the fuse 164 is blown out or not in the fuse circuit 116 of FIG. 13 is transmitted to the flip-flop 114 of FIG. 15. Therefore, if whether or not the fuse 164 of the fuse circuit 116 is blown out according to the resistance is determined, a signal selected by the fuse 164 is stored in the flip-flop 114 as long as the power supply voltage is kept at the high level.

Figure 18:
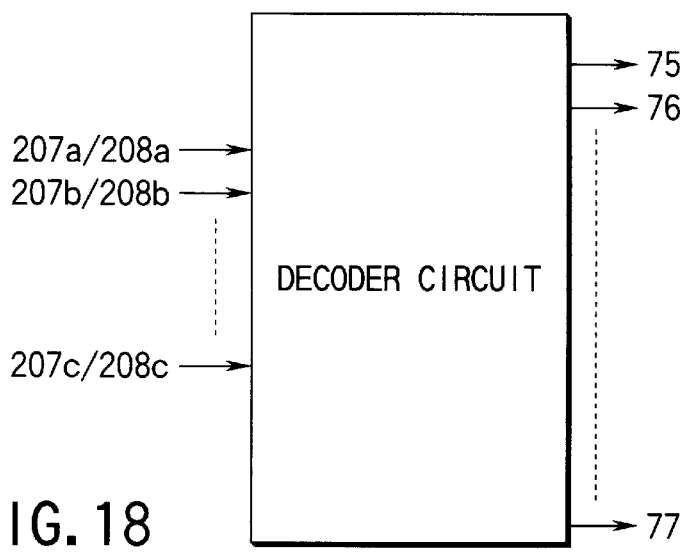
FIG. 18 is a circuit diagram showing an example of the construction of a decoder circuit in the circuit shown in FIG. 6.

Information (signals 207a/208a, 207b/208b, . . . , 207c/208c) for selecting the resistance $R_1$ stored in the flip-flop 114 is supplied to a decoder 113 as shown in FIG. 18 and converted to output signals 75, 76, . . . , 77 among which only one signal is set to the high level and the remaining signals are all set to the low level.

Selection of the resistance can be made by melting a fuse or providing a nonvolatile memory element and using data stored in the memory element instead of using the fuse.

Figure 19:
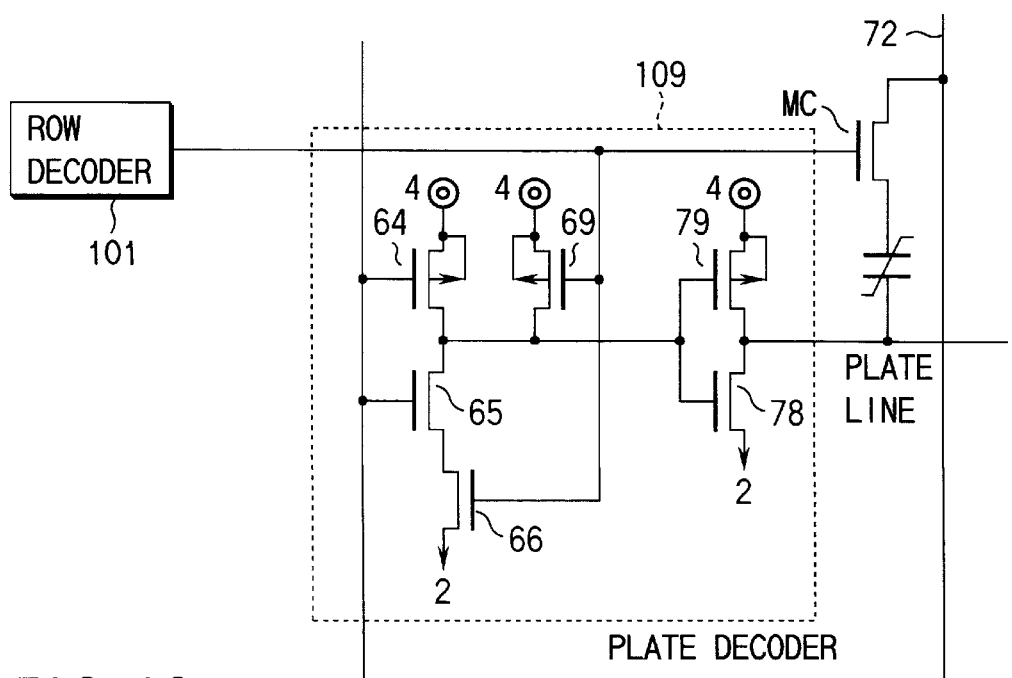
FIG. 19 is a circuit diagram showing an example of the construction of a plate decoder for generating a voltage to the plate line in the circuit shown in FIG. 6.

FIG. 19 shows an example of the construction of the plate decoder 109 for generating a voltage of the plate line in the circuit shown in FIG. 6. The plate decoder 109 includes PMOS transistors 64, 69, 79 and NMOS transistors 65, 66 and is provided for each word line. The plate decoder 109 is an AND gate for calculating the logical AND of the potential of the word line and the plate clock output from the address buffer circuit 100 and only the plate line of a row corresponding to the selected word line is selectively controlled by the plate clock. The plate line potential at this time is determined by the voltage of the power supply 4 of the plate decoder 109.

Figure 5:
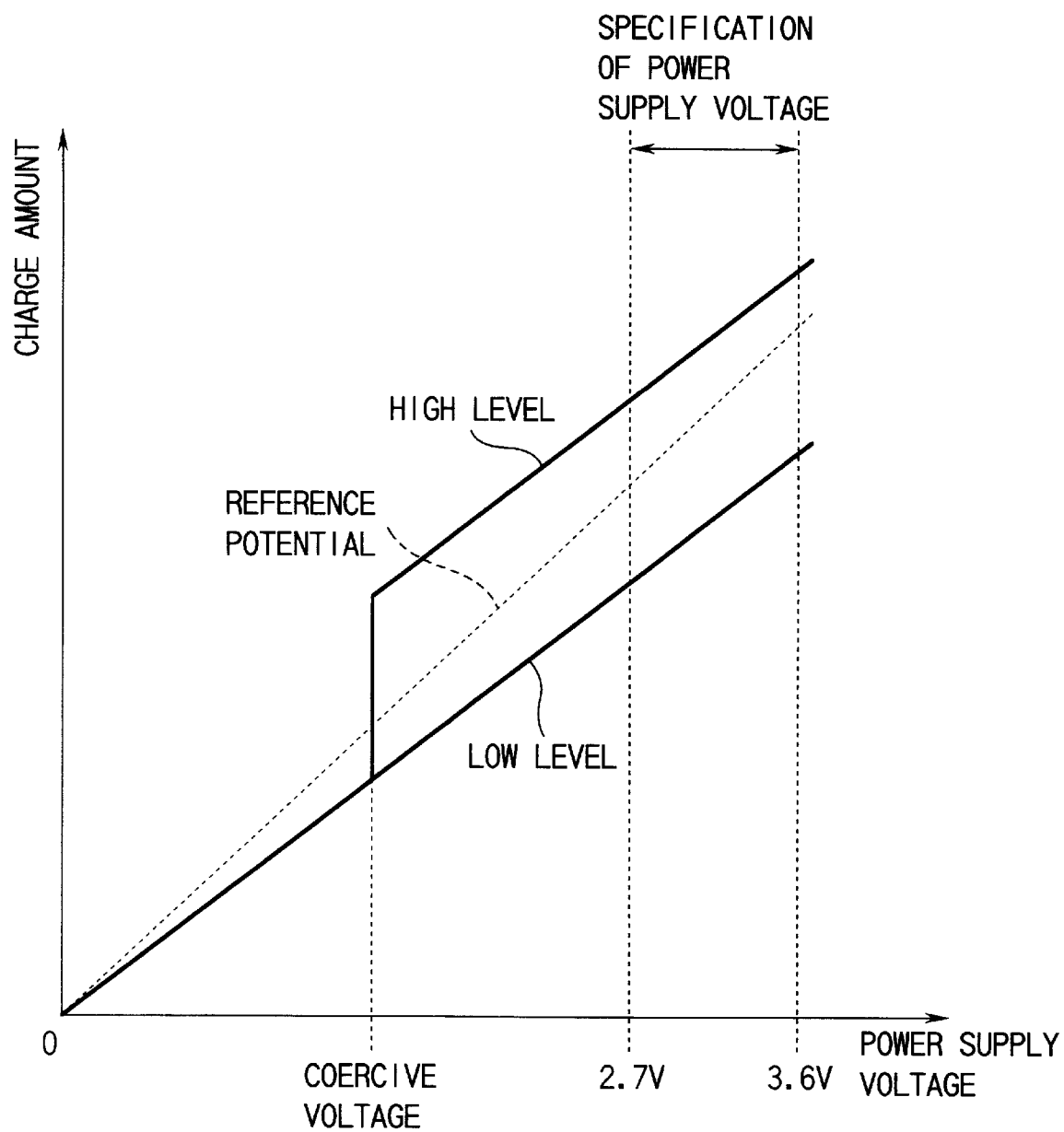
FIG. 5 is a characteristic diagram showing the relation between a charge amount of polarization of a ferroelectric film and a power supply voltage.

In this case, as shown in FIG. 5, a potential read out to the bit line 72 depends on the potential of the plate line, but the plate line potential can be independent from the external power supply voltage by making a design such that the potential of the power supply 4 of the plate decoder 109 can be made independent from the external power supply voltage. Likewise, a dummy plate decoder can be formed of an AND gate for calculating the logical AND of the potential of the dummy word line and the dummy plate clock. The control signal 53 of FIG. 8 can be generated based on the negative logic of the above logical AND. If the power supply voltage of the dummy plate decoder is made independent from the external power supply voltage, the reference voltage does not depend on the external power supply voltage. Further, at this time, the potential of the dummy plate line whose output level is variable and which does not depend on the external power supply voltage can be directly obtained by using a voltage of the power supply 3 supplied from the variable voltage generating circuit shown in FIG. 9 instead of the power supply 4.

Figure 20:
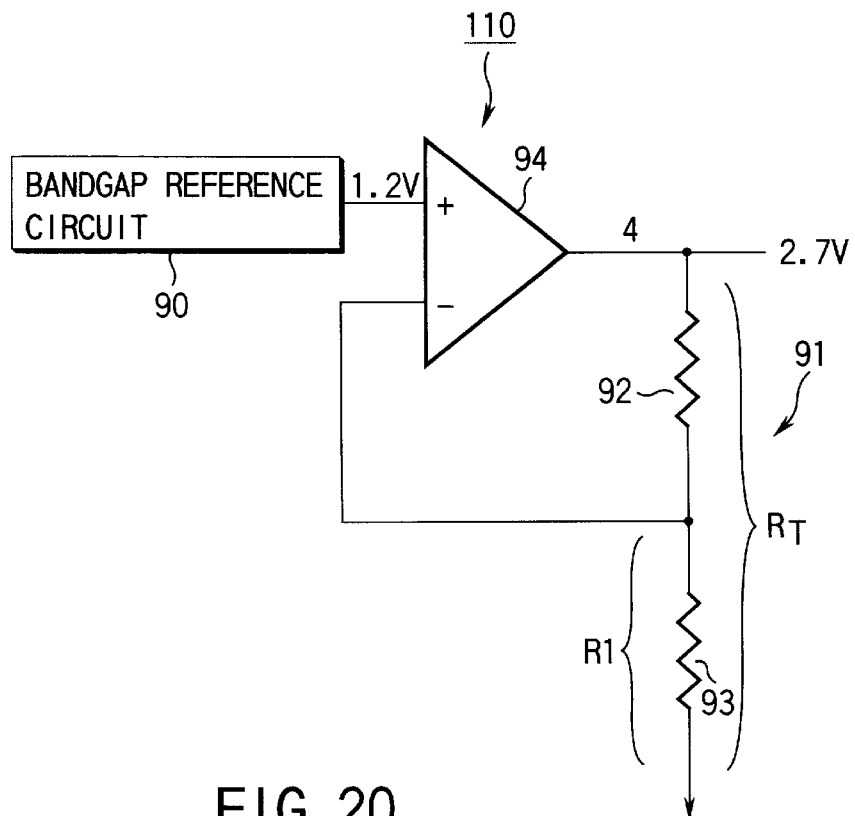
FIG. 20 is a circuit diagram showing an example of the construction of a constant voltage generator in the circuit shown in FIG. 6.

FIG. 20 shows an example of the construction of the constant voltage generator 110 in the circuit shown in FIG. 6 and the generator 110 supplies an internal power supply voltage 4 which does not depend on the external power supply voltage to the plate decoder 109. The generator 110 includes a bandgap reference circuit 90, operational amplifier 94 and voltage dividing circuit 91. An output voltage of the bandgap reference circuit 90 is applied to the non-inverting input terminal (+) of the operational amplifier 94 and the voltage dividing circuit 91 is connected between the output terminal and the inverting input terminal of the operational amplifier 94. The output voltage of the bandgap reference circuit 94 is approx. 1.2V and does not depend on a variation in the temperature and the external power supply voltage. The voltage dividing circuit 91 has resistors 92 and 93 serially connected between the output terminal of the operational amplifier 94 and the ground node and the connection node of the resistors 92 and 93 is connected to the inverting input terminal (−) of the operational amplifier 94. If the voltage dividing circuit 91 is thus formed of resistor elements, a variation in the voltage dividing ratio due to a fluctuation in the manufacturing process and the temperature characteristic can be made small. When a voltage higher than that applied to the non-inverting input terminal (+) of the operational amplifier 94 is applied to the inverting input terminal (−) thereof, an output voltage (voltage of the power supply 4) of the operational amplifier 94 is lowered, and vice versa. The operational amplifier 94 can be easily realized by use of a CMOS current mirror circuit. Thus, the potential of the inverting input terminal (−) sets the output voltage (voltage of the power supply 4) to a preset value by division of the resistances of the resistors 92 and 93.

That is, the following equation can be obtained.

Potential of the inverting input terminal (−)=R×Potential of the output terminal (power supply 3)   (3)

where R=resistance 93/(resistance 93+Resistance 92)

Figure 3A:
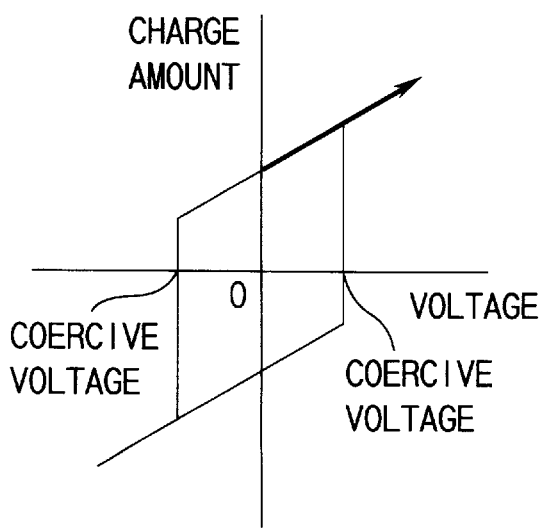
FIG. 3A is a diagram for illustrating the relation between a charge amount of polarization of a ferroelectric film and a voltage between electrodes when the bit line potential is set at a low level.
Figure 3B:
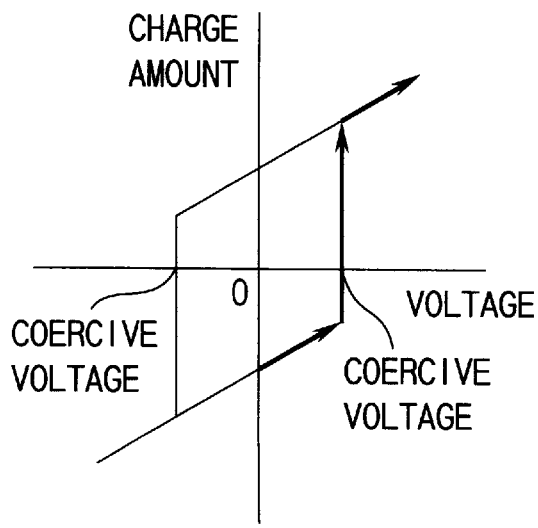
FIG. 3B is a diagram for illustrating the relation between a charge amount of polarization of a ferroelectric film and a voltage between electrodes when the bit line potential is set at a high level.

Therefore, the potential of the inverting input terminal (−) is lowered and the output potential is lowered if the potential of the inverting input terminal (−) tends to become higher than the potential of the non-inverting input terminal (+) even a bit. If the potential of the inverting input terminal (−) becomes lower than the potential of the non-inverting input terminal (+), the potential of the inverting input terminal (−) tends to increase. Thus, the potential of the inverting input terminal (−) of the operational amplifier 94 is fixed at the potential (1.2V) of the non-inverting input terminal (+) and the potential of the inverting input terminal (−) is also constantly set at 1.2V. In this case, if the resistance ratio is set to R=1.2/2.7, the output potential (power supply 4) of the constant voltage generator 110 does not depend on the external power supply voltage and is set to 2.7V as is clearly seen from FIG. 3.

With the above construction, since the reference potential applied to the reference bit line can be made variable by use of the dummy cell 105 by making the voltage applied from the variable voltage generating circuit 112 to the dummy plate line driving circuit 111 variable, a reference potential suitable for each chip can be applied even if the high level and low level of the bit line fluctuate depending on the position in which the chip is formed in the wafer. Therefore, a sufficiently large margin can be attained between the reference potential and the high level or low level of the bit line and erroneous data readout can be prevented. As a result, a stable sense and readout operation can be effected.

Further, a potential difference between a bit line to be sensed and the reference bit line can be prevented from fluctuating depending on the power supply voltage and erroneous data readout can be prevented by applying a voltage which does not depend on the power supply voltage and the temperature to the plate decoder 109 by use of the constant voltage generator 110.

Figure 4:
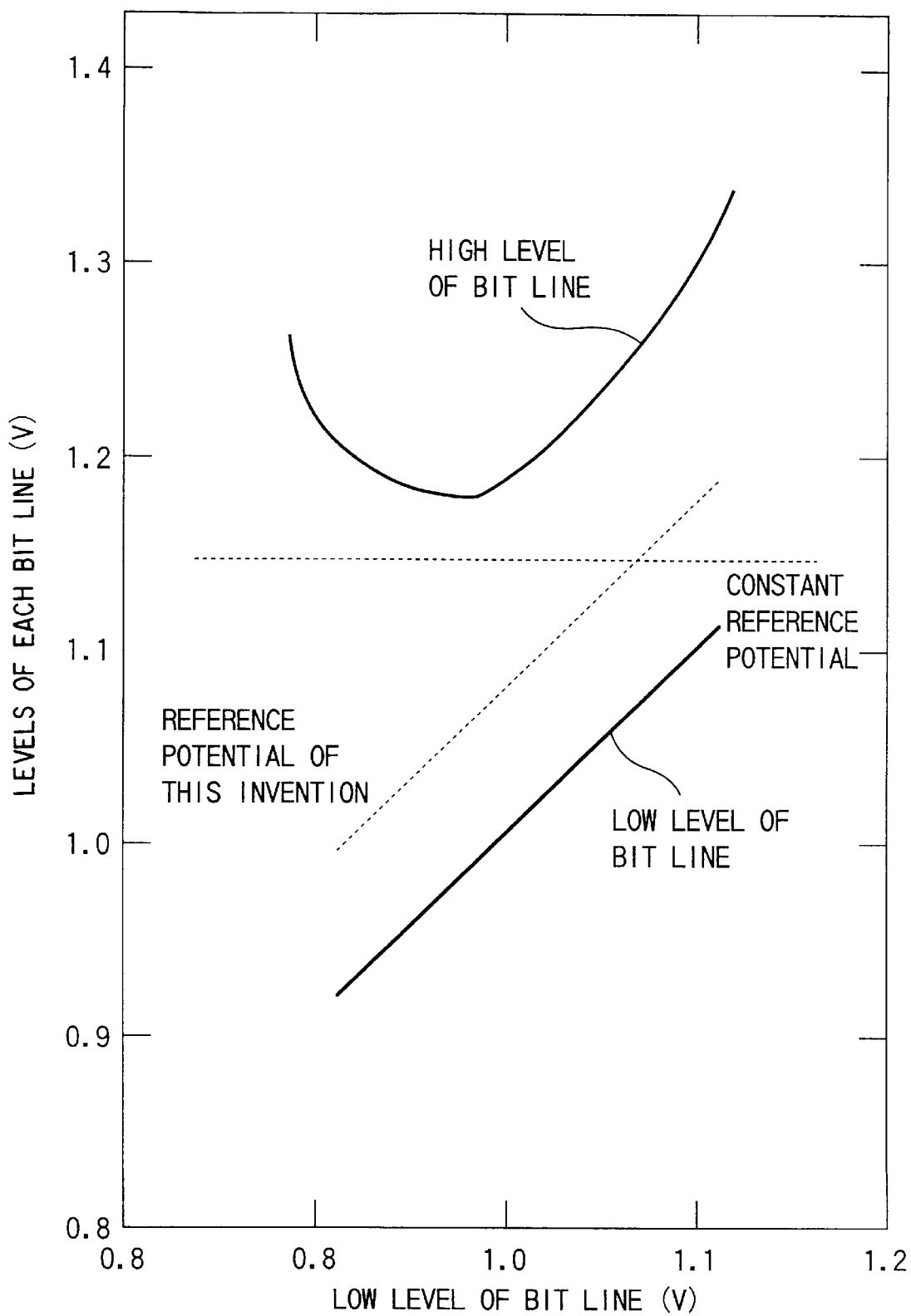
FIG. 4 is a distribution diagram showing the high level and low level of the bit lines of chips formed in different positions on a wafer.

Further, it is possible to attain a ferroelectric memory device in which a reference potential higher than the low level shown by broken lines in FIG. 4, for example, by a constant voltage can be generated according to the chip and the manufacturing yield is enhanced and which has a large electrical margin.

Figure 21:
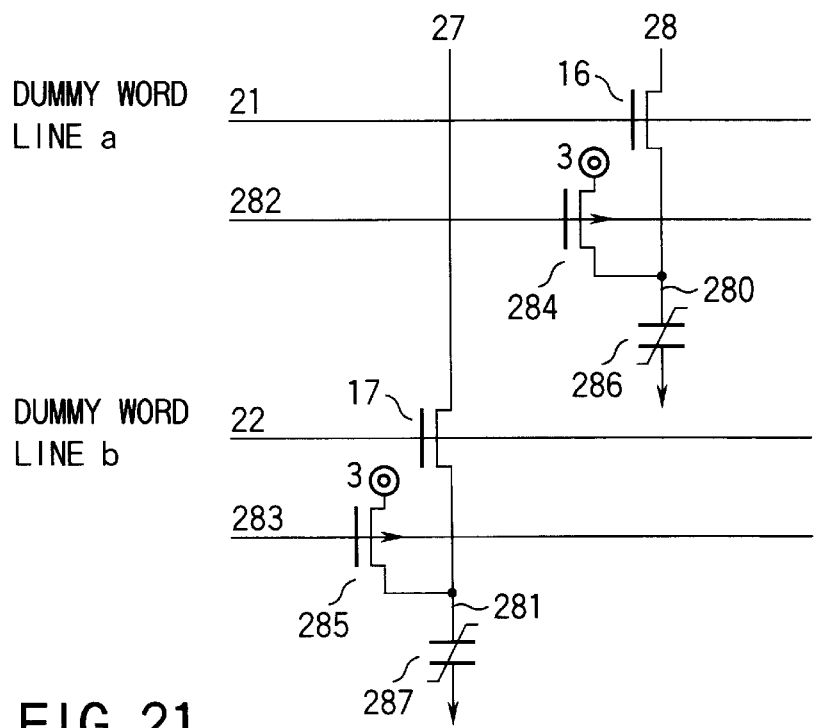
FIG. 21 is a circuit diagram showing an example of the construction of a dummy cell section, for illustrating a ferroelectric memory device according to a second embodiment of this invention.

This invention is not limited to the above embodiment and can be modified without departing from the technical scope thereof. For example, in the above embodiment, a case wherein the linear capacitors 51, 52 are used for the dummy capacitors is explained, but ferroelectric capacitors 286, 287 can be used as shown in FIG. 21. In this case, PMOS transistors 284, 285 are provided and a node 280 or 281 is previously charged to a level of the internal power supply 3 while dummy word lines 21, 22 are kept in the non-selected state by dummy cell precharge control signals 282, 283 which are set to the low level at the time of non-selection of the chip in which the chip enable signal /CE is set at the high level. Then, when the dummy word line 21 or 22 is selected, charges stored in the dummy cell 286 or 287 are discharged to the reference bit line to generate a voltage which is intermediate between the high level and low level of the bit line. Therefore, the level of the reference bit line can be changed by adjusting the voltage of the internal power supply 3 and changing the stored charge amount. Further, this invention can be applied to any type of dummy cell.

Further, in the above explanation, the reference potential of the reference bit line before the sense operation is generated by use of the dummy capacitor, but it is also possible to directly generate the reference potential of the reference bit line by use of a circuit which is the same as the circuit shown in FIG. 20. In this case, the fixed potential generated is directly applied to the node 31 or 32 of the dummy cell DCa or DCb in the circuit of FIG. 7. However, before the sense operation is started, it is necessary to set the dummy word line 21 or 22 which has been temporarily selected into the non-selected state so as to prevent the potential from disturbing the operation of the sense amplifier. It is of course possible to change the reference potential of the reference bit line as in the circuit of FIG. 20.

An example in which the bit line potential is derived according to the polarization of a cell by applying a pulse to the selected plate line and the sense and rewrite operation is effected is explained, but this invention can be applied to a system for fixedly setting the plate voltage to approximately half the power supply voltage and reading out data in the same manner as in a DRAM. In this case, if the cell is not selected, it is necessary to apply the same potential as that of the plate electrode to the storage node of the memory cell, that is, the node 29 or 30 of FIG. 7 or the node 31 or 32 which is the storage node of the dummy cell so as not to apply the electric field to the cell. Further, since charges on the storage node are gradually lost in the form of a leakage current, it is necessary to periodically effect the refresh operation in the same manner as in the DRAM. The bit line potential is set to 0V before the sense operation. If the word line is selected to turn ON the selection transistor, the bit line potential becomes higher in the case of polarization reversal than in a case where the polarization reversal is not effected, and therefore, the operation of the ferroelectric memory device which is the same as that of the circuit explained so far can be effected. Also, in this case, if the plate potential is fixed at 2.7V, the dependency on the power supply voltage can be prevented.

In the above explanation, the potentials of the plate line and the dummy plate line are set to the minimum value of the specification of the external power supply voltage. The reason why the internal fixed voltage does not depend on the external power supply voltage is that the output of the bandgap reference circuit 90 does not depend on the external power supply voltage in the circuit of FIG. 20. Therefore, it is possible to set the voltage lower than the minimum value of the specification of the power supply voltage by changing the resistance ratio. However, as is clearly seen from FIG. 5, it is necessary to pay much attention so as not to set the voltage lower than the coercive voltage.

Generally, a high speed operation can be attained in the peripheral circuit when the power supply voltage is high. From this viewpoint, it is considered to set the potentials of the plate line and the dummy plate line higher than the power supply voltage. In this case, a voltage boosted by the internal circuit of the chip may be applied to the power supply of the operational amplifier 94 of FIG. 20. Also, in this case, it is ensured that the boosted voltage does not depend on the power supply voltage by the output of the bandgap reference circuit 90. Further, a voltage generated by a voltage lowering circuit can be supplied.

As described above, according to this invention, there is provided a ferroelectric memory device in which a sufficiently large margin between the reference potential and the high level or low level of the bit line can be attained and erroneous data readout can be prevented even if the high level and low level of the bit line fluctuate depending on the position in which the chip is formed in the wafer.

Further, a ferroelectric memory device can be attained in which the potential difference between a bit line to be sensed and the reference bit line is prevented from fluctuating depending on the power supply voltage and erroneous data readout can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory device comprising:
    means for setting a potential of a bit line to one of a high level and low level according to the direction of polarization of a ferroelectric film;
    means for applying a reference potential to a reference bit line which makes a complementary pair with the bit line;
    means for comparing the potential of the bit line with the reference potential of the reference bit line and sensing and rewriting stored data; and
    means for selecting and setting the reference potential from a plurality of potential levels according to the high level and low level of the bit line.

2. The ferroelectric memory device according to claim 1, wherein said means for setting the reference potential sets the reference potential to a potential corresponding to the characteristic of a ferroelectric capacitor which fluctuates depending on the position in which the chip is formed in the wafer.

3. The ferroelectric memory device according to claim 1, wherein said means for setting the reference potential generates a potential by supplying a displacement current of a capacitor to the bit line and sets the reference potential.

4. The ferroelectric memory device according to claim 3, wherein said capacitor is a capacitor using one of a ferroelectric film and paraelectric film.

5. The ferroelectric memory device according to claim 1, wherein said means for setting the reference potential generates a potential by discharging charges stored on a capacitor to said reference bit line before the sensing operation by said means for effecting the sense and rewrite operation potential and sets the reference potential.

6. The ferroelectric memory device according to claim 5, wherein said capacitor is a capacitor using one of a ferroelectric film and paraelectric film.

7. The ferroelectric memory device according to claim 1, wherein a level of the reference potential is set based on a fixed potential generated in the chip.

8. The ferroelectric memory device according to claim 1, wherein said means for setting the reference potential selects an intermediate output level between a high level and a low level of said bit line from a plurality of output levels based on data stored in a nonvolatile memory element and fixes the same.

9. A ferroelectric memory device for reading out a high level or low level corresponding to the direction of polarization of a ferroelectric film from a memory cell to a bit line, applying a reference potential from a dummy cell to a reference bit line which makes a complementary pair with the bit line and comparing the potential of the bit line with the reference potential of the reference bit line to sense and rewrite stored data, comprising:
    a plate line driving circuit for pulse-driving a plate line associated with a memory cell selected at the time of data readout;
    a dummy plate line driving circuit for pulse-driving a dummy plate line associated with a dummy cell connected to a reference bit line which makes a complementary pair with a bit line connected to the selected memory cell;
    a constant voltage generator for applying a power supply voltage to said plate line driving circuit and dummy plate line driving circuit, said constant voltage generator including a bandgap reference circuit, an operational amplifier supplied with an output voltage of said bandgap reference circuit at a non-inverting input terminal thereof, and a voltage dividing circuit for dividing the potential of the output terminal of said operational amplifier and supplying the divided potential to an inverting input terminal of said operational amplifier, and outputting a potential of the output terminal of said operational amplifier.

10. The ferroelectric memory device according to claim 9, wherein one of a voltage generated by boosting a power supply voltage in the chip and a voltage generated by lowering the power supply voltage is supplied as a power supply voltage of said operational amplifier.

11. The ferroelectric memory device according to claim 9, wherein said voltage dividing circuit in said constant voltage generator for applying the voltage to said dummy plate line driving circuit includes at least three load elements serially connected between the output terminal of said operational amplifier and a ground node and one of said load elements is selectively connected to the inverting input terminal of said operational amplifier.

12. A ferroelectric memory device for reading out a high level or low level corresponding to the direction of polarization of a ferroelectric film from a memory cell to a bit line, applying a reference potential from a dummy cell to a reference bit line which makes a complementary pair with the bit line and comparing the potential of the bit line with the reference potential of the reference bit line to sense and rewrite stored data, comprising:
    a plate line driving circuit for fixedly driving a plate line associated with a memory cell selected;

a dummy plate line driving circuit for fixedly driving a dummy plate line associated with a dummy cell connected to a reference bit line which makes a complementary pair with a bit line connected to the selected memory cell; and a constant voltage generator for applying a power supply voltage to said plate line driving circuit and dummy plate line driving circuit, said constant voltage generator including a bandgap reference circuit, an operational amplifier supplied with an output voltage of said bandgap reference circuit at a non-inverting input terminal thereof and a voltage dividing circuit for dividing the potential of the output terminal of said operational amplifier and supplying the divided potential to an inverting input terminal of said operational amplifier, and outputting a potential of the output terminal of said operational amplifier.

13. The ferroelectric memory device according to claim 12, wherein one of a voltage generated by is boosting a power supply voltage in the chip and a voltage generated by lowering the power supply voltage is supplied as a power supply voltage of said operational amplifier.

14. The ferroelectric memory device according to claim 12, wherein said voltage dividing circuit in said constant voltage generator for applying the voltage to said dummy plate line driving circuit includes at least three load elements serially connected between the output terminal of said operational amplifier and a ground node and one of said load elements is selectively connected to the inverting input terminal of said operational amplifier.

15. A ferroelectric memory device for reading out a high level or low level corresponding to the direction of polarization of a ferroelectric film from a memory cell to a bit line, applying a reference potential from a dummy cell to a reference bit line which makes a complementary pair with the bit line and comparing the potential of the bit line with the reference potential of the reference bit line to sense and rewrite stored data, comprising:

a plate line driving circuit for pulse-driving a plate line associated with a memory cell selected at the time of data readout;

a dummy plate line driving circuit for pulse-driving a dummy plate line associated with a dummy cell connected to a reference bit line which makes a complementary pair with a bit line connected to the selected memory cell;

a constant voltage generator for applying a power supply voltage to said plate line driving circuit, said constant voltage generator including a first bandgap reference circuit, a first operational amplifier supplied with an output voltage of said first bandgap reference circuit at a non-inverting input terminal thereof, and a first voltage dividing circuit for dividing the potential of the output terminal of said first operational amplifier and supplying the divided potential to an inverting input terminal of said first operational amplifier, and supplying a potential of the output terminal of said first operational amplifier to said plate line driving circuit; and a variable voltage generating circuit for applying a power supply voltage to said dummy plate line driving circuit, said variable voltage generating circuit including a second bandgap reference circuit, a second operational amplifier supplied with an output voltage of said second bandgap reference circuit at a non-inverting input terminal thereof, and a second voltage dividing circuit for dividing the potential of the output terminal of said second operational amplifier into a plurality of potentials and selectively supplying one of the divided potentials to an inverting input terminal of said second operational amplifier, and supplying a potential of the output terminal of said second operational amplifier to said dummy plate line driving circuit.

16. The ferroelectric memory device according to claim 15, wherein one of a voltage generated by boosting a power supply voltage in the chip and a voltage generated by lowering the power supply voltage is supplied as a power supply voltage of said first operational amplifier.

17. The ferroelectric memory device according to claim 15, wherein said second voltage dividing circuit includes at least three load elements serially connected between the output terminal of said second operational amplifier and a ground node and a plurality of transfer gates which are respectively connected between the nodes of said resistor elements and the inverting input terminal of said second operational amplifier and the ON/OFF states of which are controlled to select one of the nodes.

18. A ferroelectric memory device for reading out a high level or low level corresponding to the direction of polarization of a ferroelectric film from a memory cell to a bit line, applying a reference potential from a dummy cell to a reference bit line which makes a complementary pair with the bit line and comparing the potential of the bit line with the reference potential of the reference bit line to sense and rewrite stored data, comprising:

a plate line driving circuit for fixedly driving a plate line associated with a memory cell selected at the time of data readout;

a dummy plate line driving circuit for fixedly driving a dummy plate line associated with a dummy cell connected to a reference bit line which makes a complementary pair with a bit line connected to the selected memory cell;

a constant voltage generator for applying a power supply voltage to said plate line driving circuit, said constant voltage generator including a first bandgap reference circuit, a first operational amplifier supplied with an output voltage of said first bandgap reference circuit at a non-inverting input terminal thereof, and a first voltage dividing circuit for dividing the potential of the output terminal of said first operational amplifier and supplying the divided potential to an inverting input terminal of said first operational amplifier, and supplying a potential of the output terminal of said first operational amplifier to said plate line driving circuit; and a variable voltage generating circuit for applying a power supply voltage to said dummy plate line driving circuit, said variable voltage generating circuit including a second bandgap reference circuit, a second operational amplifier supplied with an output voltage of said second bandgap reference circuit at a non-inverting input terminal thereof, and a second voltage dividing circuit for dividing the potential of the output terminal of said second operational amplifier into a plurality of potentials and selectively supplying one of the divided potentials to an inverting input terminal of said second operational amplifier, and supplying a potential of the output terminal of said second operational amplifier to said dummy plate line driving circuit.

19. The ferroelectric memory device according to claim 18, wherein one of a voltage generated by boosting a power supply voltage in the chip and a voltage generated by lowering the power supply voltage is supplied as a power supply voltage of said first operational amplifier.

20. The ferroelectric memory device according to claim 18, wherein said second voltage dividing circuit includes at least three load elements serially connected between the output terminal of said second operational amplifier and a ground node and a plurality of transfer gates which are respectively connected between the nodes of said resistor elements and the inverting input terminal of said second operational amplifier and the ON/OFF states of which are controlled to select one of the nodes.

21. A ferroelectric memory device for reading out a high level or low level corresponding to the direction of polarization of a ferroelectric film from a memory cell to a bit line, applying a reference potential from a dummy cell to a reference bit line which makes a complementary pair with the bit line and comparing the potential of the bit line with the reference potential of the reference bit line to sense and rewrite stored data, comprising:

a plate line driving circuit for pulse-driving a plate line associated with a memory cell selected at the time of data readout;

a dummy plate line driving circuit for pulse-driving a dummy plate line associated with a dummy cell connected to a reference bit line which makes a complementary pair with a bit line connected to the selected memory cell;

a constant voltage generator for applying a power supply voltage to said plate line driving circuit and said dummy plate line driving circuit, wherein said dummy cell includes: a selection transistor which has a current path connected at one end to the reference bit line, and a gate connected to a dummy word line; and a linear capacitor made of an MOS transistor which has a gate connected to another end of the current path of the selection transistor, a source and drain that are connected to a dummy plate line, and a paraelectric film serving as a gate insulation film.

22. A ferroelectric memory device according to claim 21, wherein said MOS transistor is a depletion type.

23. A ferroelectric memory device according to claim 21, wherein said constant voltage generator includes: a bandgap reference circuit; an operational amplifier having a non-inverting input terminal to which an output voltage of the bandgap reference circuit is applied; and a voltage-dividing circuit for dividing a potential at an output terminal of the operational amplifier and applying a divided voltage to the non-inverting input terminal of the operational amplifier, said voltage generator outputting a potential appearing at the output terminal of the operation amplifier.

24. A ferroelectric memory device for reading out a high level or low level corresponding to the direction of polarization of a ferroelectric film from a memory cell to a bit line, applying a reference potential from a dummy cell to a reference bit line which makes a complimentary pair with the bit line and comparing the potential of the bit line with the reference bit line which makes a complementary pair with the bit line and comparing the potential of the bit line with the reference potential of the reference bit line to sense and rewrite stored data, comprising:

a plate line connected to the memory cell;

a plate driving circuit for pulse-driving a plate line associated with a memory cell selected at the time of data readout; and a dummy plate line connected to the dummy cell; and a dummy plate line driving circuit for pulse-driving a dummy plate line associated with a dummy cell connected to a reference bit line which makes a complementary pair with a bit line connected to the selected memory cell, wherein said dummy cell includes: a selection transistor which has a current path connected at one end to the reference bit line, and a gate connected to a dummy word line; and a linear capacitor made of an MOS transistor which has a gate connected to another end of the current path of the selection transistor, a source and drain that are connected to a dummy plate line, and a paraelectric film serving as a gate insulation film.

25. A ferroelectric memory device according to claim 21, wherein said MOS transistor is a depletion type.

26. A ferroelectric memory device comprising:

a memory cell for storing a high level or low level corresponding to the direction of polarization of a ferroelectric film;

a bit line to which data stored in the memory cell is read out;

a reference bit line which makes a complementary pair with the bit line;

a dummy cell for applying a reference voltage to the reference bit line, said dummy cell including a selection transistor which has a current path connected at one end to the reference bit line, and a gate connected to a dummy word line; and a linear capacitor made of an MOS transistor which has a gate connected to another end of the current path of the selection transistor, a source and drain that are connected to the dummy plate line, and a paraelectric film serving as a gate insulation film;

a sense and rewrite amplifier for comparing the potential of the bit line with the reference potential of the reference bit line to sense and rewrite stored data;

a plate line driving circuit for pulse-driving a plate line associated with a memory cell selected at the time of data readout; and a dummy plate line driving circuit for pulse-driving a dummy plate line associated with a dummy cell connected to a reference bit line which makes a complementary pair with a bit line connected to the selected memory cell.

27. A ferroelectric memory device according to claim 26, wherein said MOS transistor is a depletion type.

* * * * *